(12) United States Patent
Bramlage et al.

(10) Patent No.: US 11,619,128 B2
(45) Date of Patent: Apr. 4, 2023

(54) ELECTRONICS ASSEMBLIES FOR DOWNHOLE USE

(71) Applicant: Baker Hughes Holdings LLC, Houston, TX (US)

(72) Inventors: Silke Bramlage, Celle (DE); Benjamin Knoop, Bergen (DE)

(73) Assignee: Baker Hughes Holdings LLC, Houston, TX (US)

( * ) Notice: Subject to any disclaimer, the term of this patent is extended or adjusted under 35 U.S.C. 154(b) by 326 days.

(21) Appl. No.: 16/557,996

(22) Filed: Aug. 30, 2019

(65) Prior Publication Data

US 2020/0072045 A1    Mar. 5, 2020

Related U.S. Application Data

(60) Provisional application No. 62/738,522, filed on Sep. 28, 2018, provisional application No. 62/726,240, filed on Sep. 1, 2018.

(51) Int. Cl.
*E21B 49/00* (2006.01)
*H05K 3/30* (2006.01)
(Continued)

(52) U.S. Cl.
CPC ............ *E21B 49/00* (2013.01); *E21B 47/017* (2020.05); *G01V 3/24* (2013.01); *H05K 1/181* (2013.01);
(Continued)

(58) Field of Classification Search
None
See application file for complete search history.

(56) References Cited

U.S. PATENT DOCUMENTS 5,087,964 A    2/1992  Hatta
5,898,218 A *  4/1999  Hirose .................... G01P 1/023
                                                      257/710

(Continued)

FOREIGN PATENT DOCUMENTS

JP          1012805 A      1/1998
JP       2006-237267       9/2006
JP       2006 237267 A     9/2006

OTHER PUBLICATIONS

PCT/US2019/049247—International Search Report and Written Opinion dated Dec. 18, 2019.

(Continued)

*Primary Examiner* — Douglas X Rodriguez
(74) *Attorney, Agent, or Firm* — Hogan Lovells US LLP

(57) ABSTRACT

Methods, systems, devices, and products for constructing a downhole tool electronics module. Methods may include creating a circuit board by metallizing at least part of a first surface on a first side of a substrate to define at least one metallized area on the first surface, wherein the substrate comprises a ceramic material and includes: the first side, including at least (i) the first surface, and (ii) an elevated surface elevated from the first surface, and a second side opposite the first side; flattening at least partially the elevated surface to a predefined first flatness to create a mounting portion by removing material from the elevated surface; attaching an electronics component to the first surface; and mounting the circuit board on an electronics carrier by adhering at least part of the mounting portion to a mounting surface on the electronics carrier. Flattening at least partially the elevated surface to the predefined first flatness may be carried out by removing the material by areal grinding.

19 Claims, 7 Drawing Sheets

(51) Int. Cl.
   *H05K 3/00*     (2006.01)
   *H05K 3/46*     (2006.01)
   *H05K 1/18*     (2006.01)
   *G01V 3/24*     (2006.01)
   *E21B 47/017*   (2012.01)

(52) U.S. Cl.
   CPC ........... H05K 3/005 (2013.01); H05K 3/0044 (2013.01); H05K 3/303 (2013.01); H05K 3/4655 (2013.01); *H05K 2201/0999* (2013.01); *H05K 2201/10151* (2013.01); *H05K 2201/2018* (2013.01); *H05K 2203/025* (2013.01); *H05K 2203/0228* (2013.01)

(56) References Cited

U.S. PATENT DOCUMENTS

| | | | |
|---|---|---|---|
| 9,431,375 B2* | 8/2016 | Defretin | H01L 23/10 |
| 2009/0096569 A1* | 4/2009 | Choi | H01G 4/30 |
| | | | 338/21 |
| 2015/0130040 A1* | 5/2015 | Defretin | H01L 23/10 |
| | | | 438/15 |
| 2015/0252666 A1* | 9/2015 | Wang | E21B 47/017 |
| | | | 166/66 |
| 2018/0160534 A1 | 6/2018 | Defretin | |

OTHER PUBLICATIONS

Extended European Search Report dated May 9, 2022 in corresponding EP Application No. EP 19855670.6.
Extended European Search Report dated May 9, 2022 in corresponding EP Application No. 19855670.6.

* cited by examiner

ELECTRONICS ASSEMBLIES FOR DOWNHOLE USE

CROSS REFERENCE TO RELATED APPLICATIONS

This application claims priority from U.S. Provisional Application Ser. No. 62/726,240, filed on Sep. 1, 2018, and from U.S. Provisional Application No. 62/738,522, filed on Sep. 28, 2018 the disclosures of which are incorporated herein by reference in their entirety.

FIELD OF THE DISCLOSURE

In one aspect, this disclosure relates generally to borehole tools, and in particular to tools used for drilling a borehole in an earth formation.

BACKGROUND OF THE DISCLOSURE

Drilling wells for various purposes is well-known. Such wells may be drilled for geothermal purposes, to produce hydrocarbons (e.g., oil and gas), to produce water, and so on. Well depth may range from a few thousand feet to 25,000 feet or more. Downhole tools often incorporate various sensors, instruments and control devices in order to carry out any number of downhole operations. Thus, the tools may include sensors and/or electronics for formation evaluation, fluid analysis, powering, monitoring and controlling the tool itself, and so on. Tools typically include one or more printed circuit boards having electrical components attached.

SUMMARY OF THE DISCLOSURE

In aspects, the present disclosure is related to a downhole tool electronics module, and methods and apparatuses for constructing a downhole tool electronics module. Methods comprise mounting a circuit board (CB) substrate with a first surface to an electronics carrier configured for conveyance in the borehole on a conveyance device, the first surface being on a first side of the CB substrate, by adhering a mounting portion of the first surface to a mounting surface of the electronics carrier; wherein the first surface is at least partially metallized and a portion of the first surface other than the mounting portion has mounted thereon at least one circuit element. The first side may be the back side.

The mounting surface and the mounting portion may each be modified by subtractive manufacture (removal of material from the surface) to a predefined flatness, referred to herein as "flattening." Different methods to create predefined flatness can be a variety of surface finishing, subtractive manufacturing methods, such as, for example, grinding, lapping, polishing, lasering, milling, etching, lapping, sanding, and so on. Mentions of grinding herein should be understood to mean any method of subtractive manufacture unless otherwise expressly stated.

The mounting portion may comprise a multi-layer ceramic. The circuit portion of the substrate may have a thickness of a first number of ceramic layers and the mounting portion has a thickness of a second number of ceramic layers, wherein the second number is at least one layer more than the first number. The substrate may be constructed by stacking ceramic sheets; laminating the stacked sheet together as a stack; and sintering the stack. At least a portion of a second side opposite the first side may have mounted thereon at least one other circuit element. Methods may include grinding the mounting portion to a predefined flatness.

The electronics carrier may comprise an electronics housing. Adhering the mounting portion to the mounting surface of the electronics carrier may be carried out by adhering the mounting portion to a mounting surface of the electronics housing. The electronics carrier may comprise a mounting frame; adhering the mounting portion to the mounting surface of the electronics carrier may be carried out by adhering the mounting portion to a mounting surface of the mounting frame.

Apparatus embodiments may include a carrier conveyable in the borehole ("conveyance device"); a tool disposed on the conveyance device including an electronics module comprising: an electronics housing comprising a mounting surface with a first predefined flatness; and a circuit board comprising a substrate with a total surface on a first side of the substrate wherein the first side is at least partially metallized, the total surface having i) a circuit portion with at least one circuit element mounted thereon and ii) a mounting portion ground to a second predefined flatness and adhered to the mounting surface.

General embodiments may include a method for constructing a downhole tool electronics module. Methods may include creating a circuit board by metallizing at least part of a first surface on a first side of a substrate to define at least one metallized area on the first surface, wherein the substrate comprises a ceramic material and includes: the first side, including at least (i) the first surface, and (ii) an elevated surface elevated from the first surface, and a second side opposite the first side; flattening at least partially the elevated surface to a predefined first flatness to create a mounting portion by removing material from the elevated surface; attaching an electronics component to the first surface; and mounting the circuit board on an electronics carrier by adhering at least part of the mounting portion to a mounting surface on the electronics carrier. Flattening at least partially the elevated surface to the predefined first flatness may be carried out by removing the material by areal grinding.

The first surface may include a first ceramic sheet and the elevated surface comprises at least a second ceramic sheet. Methods may include creating the elevated surface by punching the second ceramic sheet prior to placing the first ceramic sheet and the second ceramic sheet in a stack. The substrate may be created by stacking ceramic sheets; laminating the stacked sheet together as a stack; and sintering the stack. Methods may include flattening the mounting surface of the electronics carrier to a predefined second flatness. The substrate may comprise a monolithic substrate wherein the first surface is green milled. The substrate may comprise a molded monolithic substrate. Methods may include creating the elevated surface by at least one of: (i) molding, and (ii) green milling.

Methods may include adhering the first mounting portion to the mounting surface includes using an adhesive. The electronics carrier may be part of an electronics housing. Adhering the first mounting portion to the mounting surface of the electronics carrier may comprise adhering the mounting portion to a mounting surface of the electronics housing. The electronics carrier may comprise a mounting frame; adhering the first mounting portion to the mounting surface of the electronics carrier may comprise adhering the first mounting portion to a mounting surface of the mounting frame. The mounting frame may be made from ceramic material. The second side of the substrate may comprise a second surface and a second elevated surface elevated from the second surface. Methods may comprise flattening at least partially the second elevated surface to a predefined third flatness to create a mounting portion by removing material from the second elevated surface. The second surface may be at least partly metallized to define at least one second metallized area on the second surface, and the second side of the substrate may have at least one other electronic component mounted thereon. The predefined first flatness may be no greater than 50 micrometers. The first surface may comprise at least one of: (i) a cavity, and (ii) a bay.

General embodiments may include apparatus for performing well logging in a borehole intersecting an earth formation. Apparatus may include a downhole tool including an electronics module. The electronics module may include an electronics carrier comprising a mounting surface; a circuit board including a substrate comprising a ceramic material, the substrate comprising a first side, including at least (i) a first surface, and (ii) an elevated surface elevated from the first surface with a flattened portion having a first flatness, the flattened portion defining a mounting portion; and a second side opposite the first side, wherein the mounting portion is adhered to the mounting surface, and wherein at least part of the first surface is metallized to define at least one metallized area on the first surface; and an electronics component attached to the first surface.

Examples of some features of the disclosure may be summarized rather broadly herein in order that the detailed description thereof that follows may be better understood and in order that the contributions they represent to the art may be appreciated.

BRIEF DESCRIPTION OF THE DRAWINGS

For a detailed understanding of the present disclosure, reference should be made to the following detailed description of the embodiments, taken in conjunction with the accompanying drawings, in which like elements have been given like numerals, wherein.

DETAILED DESCRIPTION

Figure 1A:
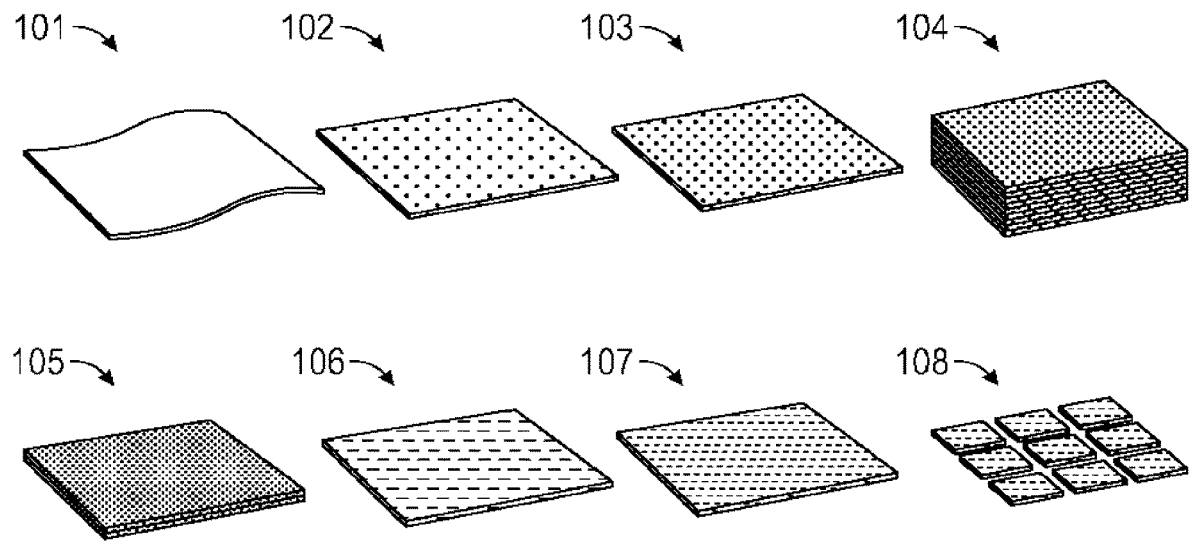
FIG. 1A shows an example process for making high temperature multilayer ceramics.

Aspects of the present disclosure relate to improvements in electronics modules for use downhole. Aspects include apparatus for drilling boreholes and downhole logging having an electronics module including one or more circuit boards having innovative adaptations for the rigors of this application.

Traditional circuit boards have been around for many decades. A circuit board (CB) is a plate or board comprising a substrate supporting different elements that make up an electrical circuit that contains the electrical interconnections between them. When employed downhole (for example, as part of a drilling tool), circuit boards may be mounted in an electronics carrier. The electronics carrier is distinct from a conveyance device (e.g., drilling tubular), which is also referred to as a "carrier" by those of skill in the art. The two terms should not be confused.

Measurement-while-drilling and logging-while-drilling (MWD/LWD) tools experience demanding conditions, including elevated levels of vibration, shock, and heat. Failures of electronic boards very often lead to tool failures and costly downtime at drillings rigs. So it is beneficial that circuit boards and related components used in these applications are configured to withstand such conditions.

Typically, a substrate is mounted in a tool by attachment to an electronics housing or mounting frame or differently shaped mounting support of the electronics carrier. The substrate may be attached using adhesives or other treatments, particularly in the case of the substrate being a ceramic board. It would be highly desirable for the substrate attach used in an electronics module for downhole tools to be strong and robust, due to the high mechanical loads (especially vibration) in downhole applications. Vibration and shock and the corresponding acceleration experienced by the components of a MWD/LWD tool may reach levels of greater than 20 times the force of gravity (gravitational units, g). Vibration may be lateral vibration, axial vibration or torsional vibration (e.g. stick slip typically <1 Hz, high frequency torsional vibration, typically between 10 to 100 Hz). Severe downhole vibrations can damage drilling equipment including electronics modules, the drill bit, drill collars, stabilizers, MWD/LWD, and Rotary Steerable System (RSS). Damaged or malfunctioning equipment requires returning to the surface for repair, adding to the time and cost of downhole operations.

Techniques for soundly bonding substrate (including ceramic based substrate) to mounting surface have recently been developed. The bond for the requisite substrate attach may be achieved by grinding the backside of the substrate to a flatness of 50 μm or less. The mounting surface, which may have similar specifications, is then bonded to the substrate with adhesives. The mounting surface may be part of a housing, e.g. the electronics housing. The part of the electronics housing to which the substrate is adhered to may be any surface of the electronics housing, such as the floor, the side walls, or the electronics housing ceiling or housing lid. Adhesives available in the industry will result in a strong bond between the substrate and the mounting surface when applied with these techniques. See James J. Licari and Leonard R. Enlow, "Hybrid Microcircuit Technology Handbook", Chapter 7, Noyes Publications, (1998). The term flatness in this disclosure is defined by the flatness definition given in the International Organization for Standardization ("ISO")-created standards document ISO 1101.

In the prior art, substrates for downhole applications are equipped with electrical components on the front side, leading to a single-sided component mount. The backside of the substrate is attached to the mounting surface on the electronics carrier. To ensure a reliable attach between the substrate and the mounting surface the backside is ground to a specified flatness and or specified curvature. In case of ceramic substrates the grinding process is challenging due to the hardness and brittleness of the material. State of the art technologies grind the whole continuous area of the backside of the substrate after metallization, laminating, and sintering of the ceramic substrate. Rather than adding layers, subtractive manufacturing involves removing sections of a material by machining, ablating, cutting it away, or the like. It can be carried out manually or, more commonly, by a process known as Computer Numerical Control (CNC) machining. Machining processes may involve turning, drilling, grinding, cutting or milling.

It would be advantageous for many projects to use a ceramic based substrate with a double-sided component mount. However, any metallization on the backside of the substrate would be removed with the grinding process, so that mounting of electronics components on the backside would no longer be possible. Metallization applied after the grinding process is not an option, as inner metallization layers couldn't be contacted with metallization of the backside performed after the sintering and grinding process. A frame or otherwise created elevated areas of the substrate may be used to make room for the components between the substrate and the mounting surface on the electronics carrier.

However, the production of such double-sided circuit boards faces challenges with regard to the substrate attach. First, the substrate attach area is reduced significantly by the footprint of the backside components or is reduced to the elevated areas, respectively. Another option would be mounting the substrate on a housing or other surface for attachment with pockets (e.g., produced by milling the housing) in which the components are placed. In any case, the backside of the substrate must be metallized and also must contain a mounting portion with predefined flatness for the adhesive attach. Thus, the surface must be ground after the metallization manufacturing step.

Pockets in a housing or downhole tool body may be used in particular in conjunction with heavy and/or bulky electronic components such as, e.g., a coil. FIG. 1B illustrates a ceramic based substrate 110 having a coil 123 mounted to it and connected to a metalized area 125. The substrate is built from at least two ceramic sheets 114 and 115, wherein ceramic sheet 115 was punched prior to stacking and sintering so that an elevated area 116 is formed on the backside side 111 (first side) of the ceramic substrate. After stacking, laminating and sintering the at least two ceramic sheets, the surface of the elevated area (elevated surface) is ground to a predetermined flatness, creating a mounting portion 117 which is adhered to a mounting surface 128 of an electronics carrier 126. The mounting portion 117 may also be referred to as a flattened surface or ground surface. This is not to preclude other techniques of subtractive manufacture, any of which may be substituted for the relative advantages provided for specific applications. The ceramic sheet creating the elevated area and providing the mounting portion may be made from a ceramic with a high heat transfer coefficient to allow heat flow from the substrate 110 to the electronics carrier 126. The electronics carrier includes a pocket 129 which gives additional space for the coil to reside in.

The mounting portion of the substrate is adhered to the mounting surface of the electronics carrier by using an adhesive 127. To achieve a reliable bonding between the ceramic substrate and the electronics carrier the mounting surface of the electronics carrier may also have a predefined flatness on the mounting surface 128. Adhesives used to bond a ceramic substrate with a metal surface include epoxy based adhesives, which may be ceramic filled. Such adhesives are electrically non-conductive and thermally conductive.

An arrangement as shown in FIG. 1B ensures that the attachment of a substrate carrying a heavy electronic component to an electronics carrier does not break under vibration and shock. In both cases, the challenges of attaching to these surfaces are similar—the reduction in attach area remains significant in comparison to single sided boards. Grinding the substrates to a defined flatness has proven to be a more difficult challenge, particularly because grinding damages or even removes completely backside metallization. To wit, in addition to a smaller adhesive attach area, substrate curvature or flatness is problematically high. Grinding only portions of a metallized substrate after metallization has not resulted in the flatness required to achieve a reliable adhesive connection in a ceramic-metal or ceramic-ceramic interface. Grinding ceramic substrates may be performed as areal grinding the whole surface of a ceramic substrate. Therefore, creating at least one elevated area on a side of a substrate enables the usage of subtractive finishing methods, such as grinding, without removing the metallization which resides in a different level, or horizon, of a ceramic substrate that has a 3-dimensional structure different to a substantially 2-dimensional structure in case of a thin, flat ceramic substrate. The mounting portion is on the metallized side of the circuit board.

The electronics carrier can be made from any material that withstands temperatures up to at least 250° C. and which can be ground to a flatness no greater 50 µm. The material of the electronics carrier should have a similar thermal expansion coefficient as the ceramic based substrate. The electronics carrier may be the downhole tool, the electronics housing or any separate structure.

Techniques in accordance with the present disclosure address the latter issue by employing a ceramic based substrate with increased thickness in attachment areas on the backside face, and then grinding or otherwise preparing through subtractive manufacture the backside in the attachment areas using the same techniques employed for single-sided substrates. In one example, thickness is increased (e.g., by about 100 microns or more) by adding additional layers of ceramic around or outside the component attach area.

Figure 1B:
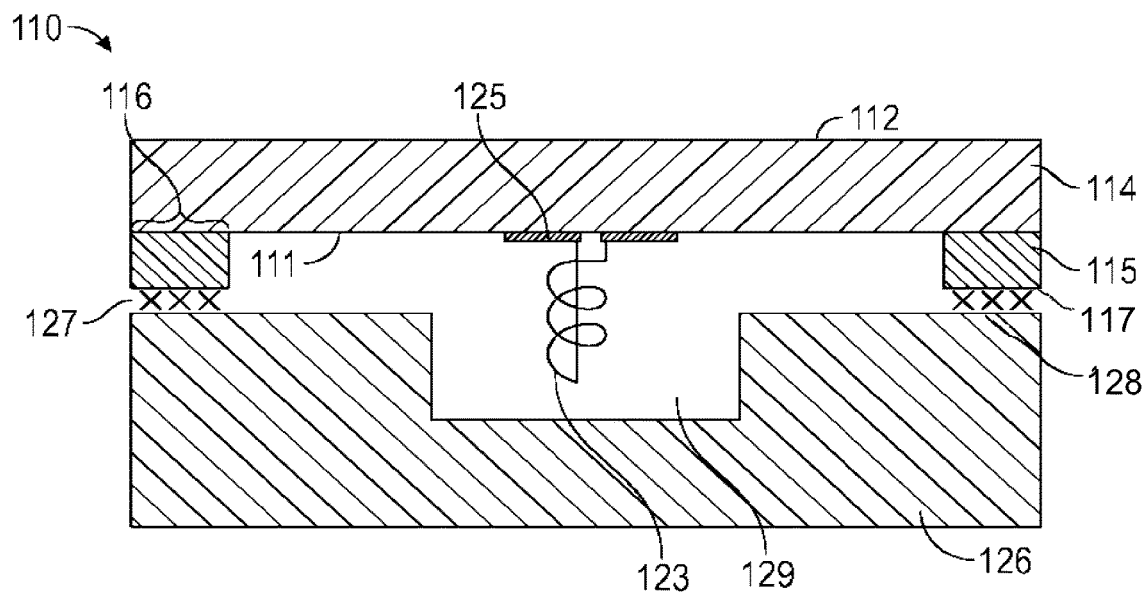
FIG. 1B illustrates a ceramic based substrate having a coil mounted to it and connected to a metalized area in accordance with embodiments of the disclosure.
Figure 1C:
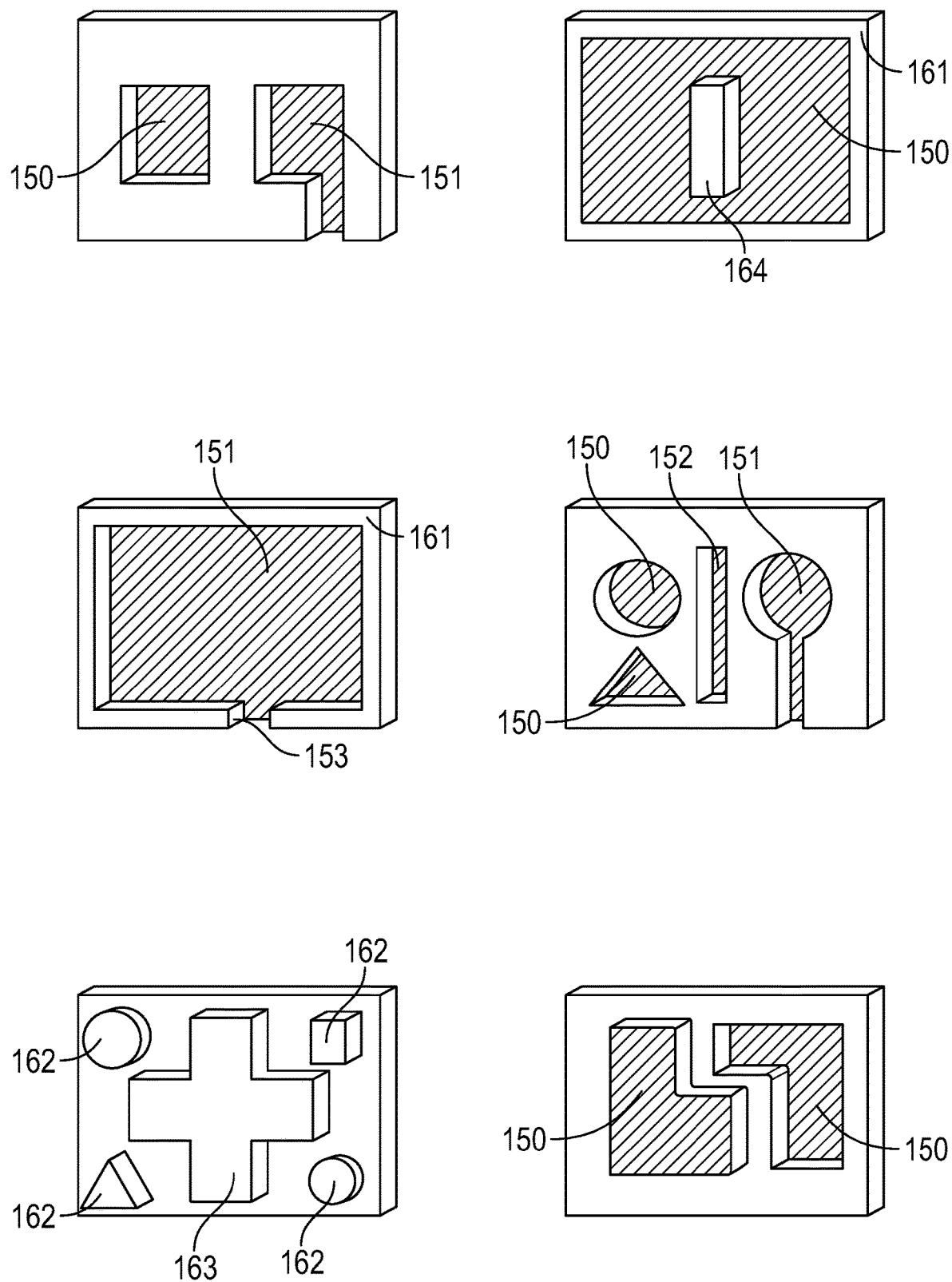
FIG. 1C illustrates elevated structures having an elevated surface in accordance with embodiments of the disclosure.

FIG. 1C illustrates elevated structures having an elevated surface in accordance with embodiments of the disclosure. Elevated (from the face) ceramic based structures (e.g., pillar 162, wall 164, island 163, frame 161, a plurality of separate elevated areas, or a single elevated area 161, 163) form a clearing (first surface) created on the backside face that may be used as component attach area 140, which is defined by the shape of the elevated ceramic structure defining at least one elevated area. The dimensions between the elevated structures may be sufficient for large components, such as a coil, electronics components (capacitors, resistors, inductors, semiconductors, or other ceramic based sub-electronics-modules). The elevated ceramic structure by adding an additional ceramic layer may be achieved by punching the additional ceramic layer to create the clearing on the backside face.

In high temperature applications, such as in a downhole tool, so called Multi Circuit Modules (MCMs) may be used. MCMs use ceramic substrates to build a circuit board. The ceramic substrate may be built from one or more ceramic layers (green sheets). At least one ceramic layer of a ceramic substrate is metallized in order to create at least one metallized area, such as a contact point and/or electric via needed to attach and connect electronic components to the ceramic substrate. Metallization may comprise at least one printed conductive path on the outside (front side or backside) or the inside of the ceramic substrate, e.g. Tungsten or MolyManganese in case of HTCC substrates.

Electronic components may be active or passive components. In embodiments electronic components may be built within the ceramic substrate by creating defined metal or semiconductor structures in the ceramic substrate or between ceramic layers making up the ceramic substrate.

Depending on how the ceramic is built the ceramic may be referred to as HTCC or LTCC ceramic (Low temperature co-fired ceramic). A ceramic substrate may be laminated and afterwards sintered or co-fired (HTCC) prior to attaching electronics components to the ceramic substrate. The electronics components are electrically connected to the metallization of the ceramic substrate by using adhesives, high temperature soldering or wire-bonding technologies. Electronics components are built from semi-conductor materials like silicon and/or germanium or alternative materials that are capable of surviving temperatures up to 150° C. to 175° C., 175° C. to 200° C., 200° C. to 225° C., 225° C. to 250° C., or 250° C. to 275° C. MCMs in high temperature applications may avoid using organic materials. Electronics components such as capacitors, resistors, inductor, semiconductors, or integrated circuits are not potted or isolated. Connecting capacitors resistors or inductors may use solder (e.g. high temperature solder). Semiconductor components are often not soldered to the metallization of the ceramics substrate but interconnected by wire-bonding or using adhesives. Semiconductor component may be wire-bonded to the substrate as a so called "bare die". Soldering is used with semiconductor components only rarely, because soldering is leading to interaction between degassing solder flux material and the semi-conductor material.

Wire-bonding is a welding technique not using flux material. The coefficient of thermal expansion may be taken into account when selecting materials to build electronic components to be bonded to ceramic substrates. Ideally, the coefficient of thermal expansion of the electronics components and the ceramic substrate should match sufficiently. Electronic components are attached to at least one side of the ceramic substrate. In alternative embodiments electronics components are attached to both sides of the ceramic substrate (front side and backside). Electronics components may also be included inside the ceramic substrate. Feedthroughs are configured for providing pathways between the front side and the backside for connections between electronic components of the two sides of the substrate. Feedthroughs may be metallized.

MCMs are encapsulated in housings to protect the substrate as well as the electronics components from environments which may lead to degradation of materials used in MCMs (environmental gases, such as, for example, gases originating from organic materials used in potting material, solder, isolation material or polymer seals). The MCM housings are in many applications hermetically sealed by either closing the housing using welding technologies or sealing the housing by using metal seals. Alternatively, instead of using a pure ceramic substrate, composite substrates such as Rogers 4003™ materials may be used. Rogers 4003™ refers to woven glass reinforced hydrocarbon/ceramics with the electrical performance of PTFE/woven glass and the manufacturability of epoxy/glass.

MCMs (and ceramic substrate circuit boards, in general) use adhesives to mount electronics components to the ceramic substrate and the metallized areas, respectively, depending on whether the adhesive should provide an electronic pathway the adhesive is electrically conductive (silver filled adhesives) or non-conductive adhesives (ceramic filled adhesive). For attachments that should provide thermal conductivity (substrate—electronics carrier attach) ceramic filled adhesives using thermally conductive ceramic material are used.

Electronics boards comprising circuit boards in downhole applications may reside in the downhole tool inside a cavity in the collar closed by a hatch cover or a sleeve. Alternatively, the circuit board may reside inside a container inside the inner bore of a downhole tool through which the drilling fluid travels downhole (probe based downhole tool). In another embodiment a circuit board may reside in a mega frame, which is an electronics frame holding and encapsulating one or more electronic boards and can be easily be removed from the downhole tool and be replaced as one unit. The electronics board inside the mega frame may be additionally covered by an electronics housing. The mega frame may comprise a frame portion holding the electronics boards with or without the electronics housing and a cover portion closing the mega frame to build a one piece electronic module unit which may again be hermetically sealed to avoid gas or fluid ingress. The mega frame is located in a pocket in the collar of a downhole tool or inside a container in the inner bore of the downhole tool. The mega frame may be made from metal, or organic materials such as, e.g. Polyether Ether Keton (PEEK). Mega frames may have a connector which is contacted by at least one conductor which may connect the mega frame with another mega frame or another electronic board, units, power supply or sensor. Alternatively, the communication with the electronic inside the mega frame may be performed through a wireless communication path. The electronic board may also be encapsulated in a housing which may be hermetically sealed (welded or metallic seals). Electronic boards (with or without housings) may be either fixedly connected inside the downhole tool (collar, container in inner bore (probe), mega frame) by using a fixation member, which may be a screw, an adhesive, or a clamp. The fixation may include a biasing member such as a spring or an elastomeric material which may be located somewhere inside the cavity in which the electronic board or electronic housing resides. The biasing member compensates for vibration and shocks generated during the downhole operation of the downhole tool.

Aspects of the present disclosure include methods for constructing a downhole tool electronics module. Methods include mounting a ceramics-based circuit board (CB) substrate to an electronics carrier conveyable in the borehole. The CB is mounted by attaching a surface on at least one side of the CB substrate to the electronics carrier, although multiple sides may be attached. One technique for attachment uses adhesives to join the surface of the ceramics-based substrate, having high flatness, to another surface (e.g. a metal surface or another ceramic surface) having high flatness that is incorporated in the electronics carrier. The attached surface of the ceramics-based substrate may be referred to as the 'back side.' At least one other circuit element may be mounted on the substrate on the opposite side.

Mounting may be carried out by adhering a mounting portion of the first surface to a mounting surface of the electronics carrier. The mounting surface and the mounting portion may each be ground to a predefined flatness, such as a flatness of no greater than 100 μm, 80 μm, 70 μm, 60 μm, 50 µm, 40 µm, 30 µm, or 20 µm. Method embodiments may include grinding the mounting portion to a predefined flatness.

In various embodiments, the mounting portions may be on either side of the substrate, may be used for mounting the substrate to a frame, a mounting support or housing, or may be used to mount a secondary ceramics-based substrate on top of the first substrate. The mounting portions may be formed as continuous ceramic structure or as an island. In embodiments where the mounting portion is located on the front side of the substrate, the back side may not have a circuit element.

The mounting portion may comprise a multi-layer ceramic, such as a high temperature co-fired ceramic (HTCC). The substrate may be manufactured using either high or low-temperature, co-fired ceramics (e.g., alumina ceramics). Some substrates employ 90% Aluminum Oxide Ceramic ($Al_2SO_3$) or Aluminum Nitride (AlN) with Tungsten, Platinum or Molybdenum metallization. LTCC substrates have glass added to the Aluminum ceramic. Co-fired ceramic devices may be monolithic microelectronic devices where the ceramic support structure and any conductive, resistive, and dielectric materials are fired in a kiln in their entirety at the same time. Other types of ceramic and non-ceramic structures, including composite or conventional materials, may be employed for various reasons and in particular applications for their respective advantages. Further, the ceramic-based techniques herein are not limited to multilayer ceramic. In some embodiments of the present disclosure, ceramics may be created in monolithic material prior to sintering. A depression or an elevated area on one side of the ceramic may be created by using e.g. molding or green milling techniques. A monolithic ceramic substrate has a thickness of at least 500 micrometers.

FIG. 1A shows an example process for making high temperature multilayer ceramics. LTCC ceramics are manufactured in the same fashion and can be used in the same way. HTCC substrates may be produced by milling ceramic and glass powders of a specific composition, along with small quantities of binding agent and solvent to create a homogeneous slurry. This slurry is then cast to form sheets (ceramic layers) of uniform thickness (e.g., 100 µm-500 µm), known as green sheets (101). Electrical structures (e.g tracks, pads) may be defined on the ceramic sheets by screen-printing using refractory metal pastes (103) (e.g. Au or Ag based). Additionally or alternatively, the sheets may be punched or molded to form cavities and vias, which can be filled with a metal paste to create vertical and horizontal connections for the electrical feedthroughs (102). The sheets are then stacked (104) and laminated (105). Stacking ceramics sheets is also referred to as take stacking. The multilayer ceramic may then be co-fired at high temperatures to form a solid and hermetic ceramic (106). The process of building electrical lines and contact points in or on the substrate is referred to as metallization. For HTCC, a final metal coating or plating (e.g., a plated Ni, Ni/Pd/Au, or Ni/Au coating) on the accessible metal structures (metallization) is applied (107) as corrosion protection, and in some cases smaller components may be separated by dicing the sheet (108).

In embodiments of the present disclosure, the circuit portion of the substrate may have a first thickness and the mounting portion may have a second thickness which is greater. The variance in thicknesses may be a result of a different number of layers in a particular area (e.g., the circuit portion). The layers may be added to the substrate as additional ceramic green sheets with cut outs in defined areas. The cutouts may be punched with round or square tools, but may also be fabricated using a laser or the like, or may be implemented using a form during green sheet fabrication. The layers may be added in the stacking process (104) and then processed as part of the stack together with the functional layers, as described in greater detail above with respect to FIG. 1A.

As noted above, the substrate may be constructed by stacking ceramic sheets as modified according to the techniques of the disclosure; laminating the stacked sheet together as a stack; and sintering the stack. Forming the cutouts of the green sheets always happens prior to the sintering process. After the stacking of the cut out green sheets the substrate comprises a 3D structure (length, width, height) which comprises at least one depression (cavity, bay, gap, recess, notch, ditch) and at least one elevation (frame, island, pillar). The largest extension of the depression measured in a direction parallel to the surface of the substrate may be 5 mm to 10 mm, or 10 mm to 15 mm, 15 mm to 20 mm, 20 mm to 30 mm, or 30 mm to 40 mm, or 40 mm to 100 mm. During the sintering process the side of the substrate comprising the depression may be oriented downwards (direction of the gravitational force) or oriented upwards (opposite direction of the gravitational force). The 3D structure of the substrate may comprise at least one depression on both sides of the substrate (front side and backside), defining an elevated area of the first surface (backside) and of a second surface (front side). Grinding the elevated areas on the first and second side defines mounting portions on both sides of the substrates (first mounting portion on the first side and second mounting portion on the second side). Mounting portions on both sides of the substrate provide opportunity to adhere the substrate with one first mounting portion to a mounting surface of an electronics carrier and on the opposite side mount the second mounting portion to another substrate (daughter circuit board), a mounting frame, a mounting support or another electronics carrier. Both sides of such a substrate may have electronics components attached: electronics components on the first side and electronics components on the second side. While in most cases the surface of the mounting portion has a normal vector which is perpendicular to one of the circuit board main axis, there may exist embodiment where the normal vector of the surface of the mounting portion has a normal vector that has an angle to one of the circuit board main axis which is different from 90° (89° to 85°, 85° to 80°, 80° to 75°, or 75° to 70°, or 70° to 60°, or 60° to 50°).

In embodiments of the present disclosure, the circuit portion of the substrate may have a thickness of a first number of ceramic layers and the mounting portion may have a thickness of a second number of ceramic layers. The second number may be at least one layer more than the first number. In some applications, the optimal difference may be in a range from 1-2 layers, 1-3 layers, 1-4 layers, 2-5 layers, or 5 to 10 layers. In some instances with the specified dimensions and materials typically used in downhole CBs, for example, three additional layers have proven to result in an optimal increase in thickness sufficient to level the backside without harming the metallization during grinding, while also maintaining cost efficiency and standard manufacturing infrastructure of the substrates.

The electronics carrier may comprise an electronics housing. Alternatively or additionally, the electronics carrier may comprise a mounting frame or mounting support. Adhering the mounting portion to the mounting surface of the electronics carrier may be carried out by adhering the mounting portion to a mounting surface of the electronics housing, the mounting frame, the mounting support or other components structurally incorporated in the tool. The electronics housing or the mounting frame may be made of ceramics, kovar, molybdenum, steel, titanium, Inconel, aluminum, alumina composites, combinations of these, or other materials known in the art. The mounting frame or mounting support may be made of thermally conductive material (metal based or ceramic based with a large heat transfer coefficient).

Aspects of the disclosure may include an apparatus for performing well logging and measurement in a borehole intersecting an earth formation. The apparatus may include a conveyance device; and a downhole tool disposed on the conveyance device including an electronics module. The electronics module may include an electronics housing comprising a mounting surface with a predefined flatness (e.g., a flatness of no greater than 50 µm); and a circuit board comprising a substrate with a total surface on a first side of the substrate. The total surface may have i) a circuit portion with at least one circuit element mounted thereon and ii) a mounting portion ground to a predefined flatness and adhered to the mounting surface.

Techniques described herein are particularly suited for use in measurement of values of properties of a formation downhole or of a downhole fluid while drilling, through the use of instruments which may utilize CBs as described herein. These values may be used to evaluate and model the formation, the borehole, and/or the fluid, estimate or measure information needed for borehole navigation (e.g. inclination, azimuth, position), and for conducting further operations in the formation or the borehole.

Figure 2:
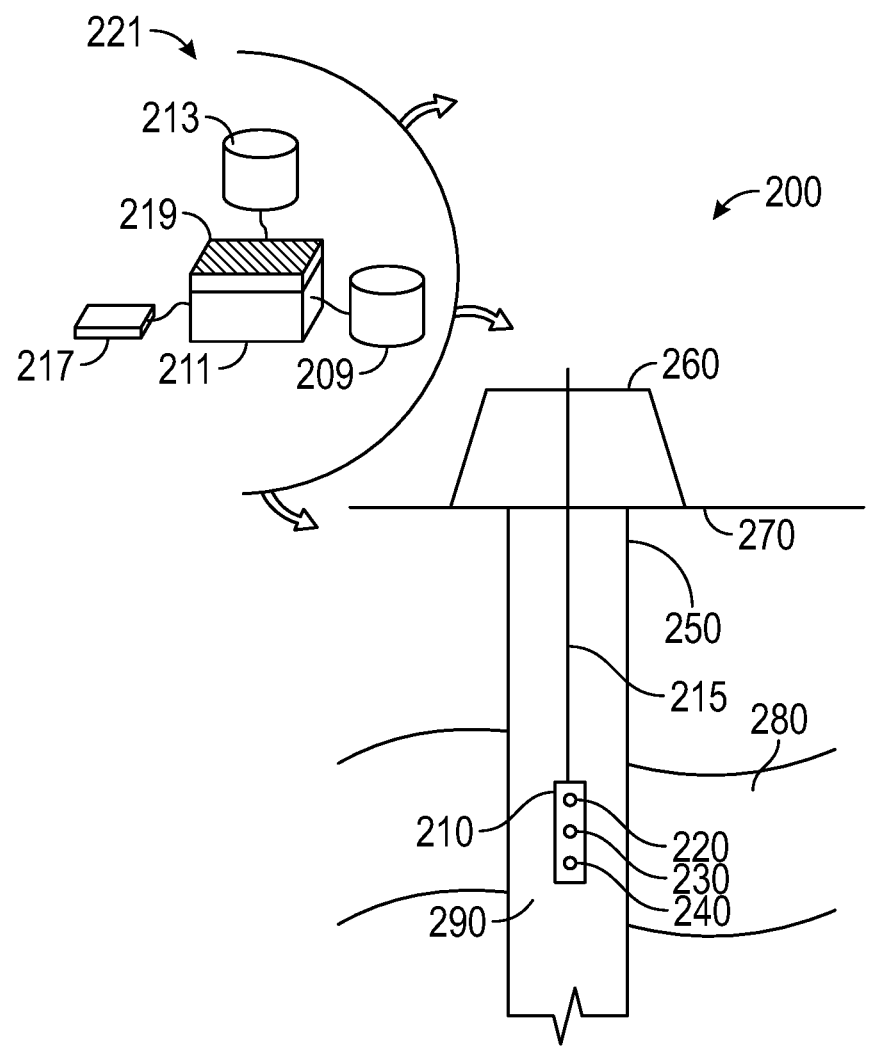
FIG. 2 schematically illustrates a system having a downhole tool configured to acquire information in a borehole intersecting a volume of interest of an earth formation.

FIG. 2 schematically illustrates a system 200 having a downhole tool 210 configured to acquire information in a borehole 250 intersecting a volume of interest of an earth formation 280 for estimating density, oil saturation, porosity, resistivity, acoustic travel time and/or other parameters of interest of the formation 280 or the borehole 250. The parameters of interest may include information relating to a geological parameter, a geophysical parameter, a petrophysical parameter, and/or a lithological parameter. Thus, the tool 210 may include sensors 220, 230 and 240 for detecting physical phenomena indicative of a parameter of interest. Sensors 220, 230 and 240 may include sensors for estimating formation resistivity, dielectric constant, the presence or absence of hydrocarbons, acoustic density, bed boundary, formation density, nuclear density and certain rock characteristics, porosity, permeability, capillary pressure, and relative permeability.

The system 200 may include a conventional derrick 260, a rotary table 270 and a conveyance device 215, which may be rigid or non-rigid, and may be configured to convey the downhole tool 210 into wellbore 250 in proximity to formation 280. The conveyance device 215 may be a drill string, coiled tubing, a slickline, an e-line, a wireline, etc. Downhole tool 210 may be coupled or combined with additional tools. Thus, depending on the configuration, the tool 210 may be used during drilling and/or after the borehole (wellbore) 250 has been formed. While a land system is shown, the teachings of the present disclosure may also be utilized in offshore or subsea applications. The conveyance device 215 may include embedded conductors for power and/or data for providing signal and/or power communication between the surface and downhole equipment. The conveyance device 215 may include a bottom hole assembly, which may include a drilling motor for rotating a drill bit. Drilling fluid 290 may be present between the formation 280 and the downhole tool 210.

Certain embodiments of the present disclosure may be implemented with a hardware environments (221) that includes an information processor 211, an information storage medium 213, an input device 217, processor memory 219, and may include peripheral information storage medium 209. The hardware environments may be in the well, at the rig, or at a remote location. Moreover, the several components of the hardware environments may be distributed among those locations. The input device 217 may be any data reader or user input device, such as data card reader, keyboard, USB port, etc. The information storage medium 213 stores information provided by the detectors. Information storage medium 213 may include any non-transitory computer-readable medium for standard computer information storage, such as a USB drive, memory stick, hard disk, removable RAM, EPROMs, EAROMs, flash memories and optical disks or other commonly used memory storage system known to one of ordinary skill in the art including Internet based storage. Information storage medium 213 stores a program that when executed causes information processor 211 to execute operations as described herein. Information storage medium 213 may also store the formation information or drilling operation information provided by the user, or the formation information may be stored in a peripheral information storage medium 209, which may be any standard computer information storage device, such as a USB drive, memory stick, hard disk, removable RAM, or other commonly used memory storage system known to one of ordinary skill in the art including Internet based storage. Information processor 211 may be any form of computer or mathematical processing hardware, controlling hardware, including Internet based hardware. When the program is loaded from information storage medium 213 into processor memory 219 (e.g. computer RAM), the program, when executed, causes information processor 211 to retrieve detector information from either information storage medium 213 or peripheral information storage medium 209 and process the information to estimate a parameter of interest. Information processor 211 may be located on the surface or downhole.

The term "information" as used herein includes any form of information (analog, digital, EM, printed, etc.). As used herein, a processor is any information processing device that transmits, receives, manipulates, converts, calculates, modulates, transposes, carries, stores, or otherwise utilizes information. In several non-limiting aspects of the disclosure, an information processing device includes a computer that executes programmed instructions for performing various methods. These instructions may provide for equipment operation, control, data collection and analysis and other functions in addition to the functions described in this disclosure. The processor may execute instructions stored in computer memory accessible to the processor, or may employ logic implemented as field-programmable gate arrays ('FPGAs'), application-specific integrated circuits ('ASICs'), other combinatorial or sequential logic hardware, and so on.

In other embodiments, such electronics may be located elsewhere (e.g., at the surface, or remotely). To perform the measurement during a single trip, the tool may transmit the information acquired by sensor array 230 to the surface for analysis. For instance, a communication line for transmitting the acquired information may be an optical fiber, a metal conductor (wired pipe), a fluid column (mud pulse telemetry), or any other suitable signal conducting medium. It should be appreciated that the use of a "high bandwidth" communication line may allow surface personnel to monitor and control the measurement activity in "real time." Each of the components described above may be implemented as one or more electrical components, such as integrated circuits (ICs), operatively connected via a circuit board in accordance with techniques of the present disclosure.

Aspects of the present disclosure are subject to application in various different embodiments. In some general embodiments, conveyance device 215 is implemented as a tool string of a drilling system, and measurements taken in the borehole may be characterized as "logging-while-drilling" (LWD) or "measurement-while-drilling" (MWD) operations.

Figure 3:
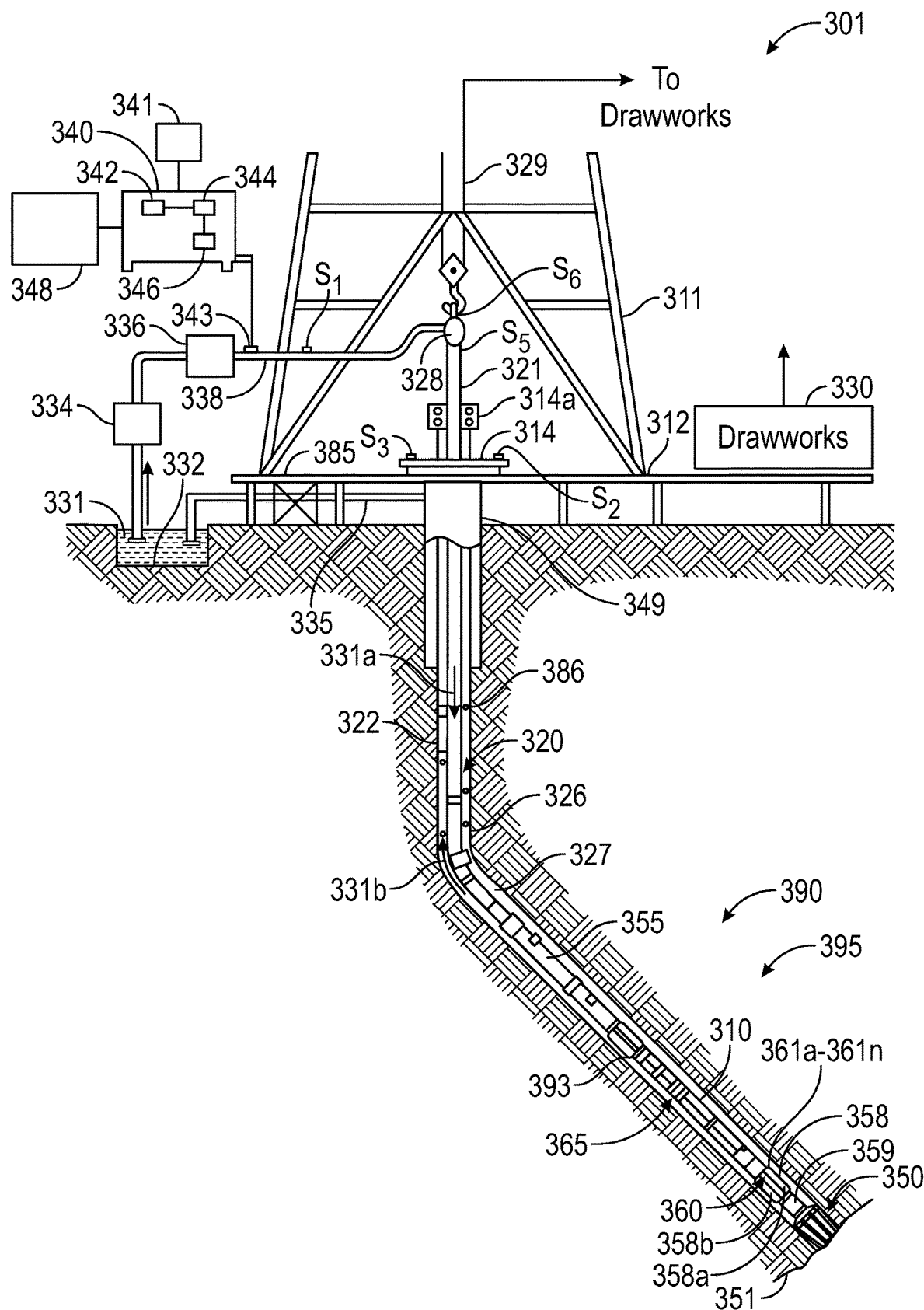
FIG. 3 shows an example embodiment of an MWD system for evaluation of an earth formation using measurements from a well logging tool.

FIG. 3 shows an example embodiment of an MWD system for evaluation of an earth formation using measurements from a well logging tool. The system 301 includes a carrier 320 that is shown disposed in a wellbore or borehole 326 that penetrates at least one earth formation 395.

FIG. 3 shows a drill string 320 including a bottomhole assembly (BHA) 390 conveyed in the borehole 326 as the conveyance device. The drilling system 301 includes a conventional derrick 311 erected on a platform or floor 312 which supports a rotary table 314 that is rotated by a prime mover, such as an electric motor (not shown), at a desired rotational speed. A tubing (such as jointed drill pipe 322), having the drilling assembly 390, attached at its bottom end extends from the surface to the bottom 351 of the borehole 326. A drill bit 350, attached to drilling assembly 390, disintegrates the geological formations when it is rotated to drill the borehole 326. The drill string 320 is coupled to a drawworks 330 via a Kelly joint 321, swivel 328 and line 329 through a pulley. Drawworks 330 is operated to control the weight on bit ("WOB"). The drill string 320 may be rotated by a top drive (not shown) instead of by the prime mover and the rotary table 314. Alternatively, a coiled-tubing may be used as the tubing 322. A tubing injector 314a may be used to convey the coiled-tubing having the drilling assembly attached to its bottom end. The operations of the drawworks 330 and the tubing injector 314a are known in the art and are thus not described in detail herein.

A suitable drilling fluid 331 (also referred to as the "mud") from a source 332 thereof, such as a mud pit, is circulated under pressure through the drill string 320 by a mud pump 334. The drilling fluid 331 passes from the mud pump 334 into the drill string 320 via a discharger 336 and the fluid line 338. The drilling fluid 331a from the drilling tubular discharges at the borehole bottom 351 through openings in the drill bit 350. The returning drilling fluid 331b circulates uphole through the annular space 327 between the drill string 320 and the borehole 326 and returns to the mud pit 332 via a return line 335 and drill cutting screen 385 that removes the drill cuttings 386 from the returning drilling fluid 331b. A sensor S1 in line 338 provides information about the fluid flow rate. A surface torque sensor S2 and a sensor S3 associated with the drill string 320 respectively provide information about the torque and the rotational speed of the drill string 320. Tubing injection speed is determined from the sensor S5, while the sensor S6 provides the hook load of the drill string 320.

In some applications, the drill bit 350 is rotated by only rotating the drill pipe 322. However, in many other applications, a downhole motor 355 (mud motor) disposed in the BHA 390 also rotates the drill bit 350. The rate of penetration (ROP) for a given BHA largely depends on the WOB or the thrust force on the drill bit 350 and its rotational speed.

A surface control unit or controller 340 receives signals from the downhole sensors and devices via a sensor 343 placed in the fluid line 338 and signals from sensors S1-S6 and other sensors used in the system 301 and processes such signals according to programmed instructions provided to the surface control unit 340. The surface control unit 340 displays drilling parameters and other parameters of interest related to the borehole, formation, and drilling operations, and other information on a display/monitor 341 that is utilized by an operator to control the drilling operations. The surface control unit 340 may be a computer-based unit that may include a processor 342 (such as a microprocessor), a storage device 344, such as a solid-state memory, tape or hard disc, and one or more computer programs 346 in the storage device 344 that are accessible to the processor 342 for executing instructions contained in such programs. The surface control unit 340 may further communicate with a remote control unit 348. The surface control unit 340 may process data relating to the drilling operations, data from the sensors and devices on the surface, and data received from downhole; and may control one or more operations of the downhole and surface devices. The data may be transmitted in analog or digital form.

The BHA 390 may include a tool 310 configured for performing well logging measurements. The BHA 390 may also contain other formation evaluation sensors or devices (also referred to as measurement-while-drilling ("MWD") or logging-while-drilling ("LWD") sensors or tools) determining resistivity, density, porosity, permeability, acoustic properties, nuclear-magnetic resonance properties, formation pressures, borehole temperature, properties or characteristics of the fluids downhole and other desired properties of the formation 395 surrounding the BHA 350. For convenience, all such sensors are generally denoted herein by numeral 365. The BHA 390 may further include a variety of other sensors and devices 359 for determining one or more properties of the BHA 390, such as vibration, bending moment, acceleration, oscillations (drill string RPM), whirl, stick-slip, weight-on-bit, fluid flow rate, pressure, temperature, rate of penetration, azimuth, tool face, inclination, drill bit rotation (Bi RPM), etc.

The BHA 390 may include a steering apparatus or tool 358 for steering the drill bit 50 along a desired drilling path. In one aspect, the steering apparatus may include a steering unit 360, having a number of force application members 361a-361n. The force application members may be mounted directly on the drill string, or they may be at least partially integrated into the drilling motor. In another aspect, the force application members may be mounted on a sleeve, which is rotatable about the center axis of the drill string. The force application members may be activated using electro-mechanical, electro-hydraulic or mud-hydraulic actuators. In yet another embodiment the steering apparatus may include a steering unit 358 having a bent sub and a first steering device 358a to orient the bent sub in the wellbore and the second steering device 358b to maintain the bent sub along a selected drilling direction. The steering unit 358, 360 may include near-bit inclinometers, accelerometers and magnetometers.

The drilling system 301 may include sensors, circuitry and processing software and algorithms for providing information about desired drilling parameters relating to the BHA, drill string, the drill bit and downhole equipment such as a LWD tool, drilling motor, steering unit, thrusters, reamers, stabilizers etc. Many current drilling systems, especially for drilling highly deviated and horizontal wellbores, utilize coiled-tubing for conveying the drilling assembly downhole. In such applications a thruster may be deployed in the drill string 320 to provide the required force on the drill bit.

Exemplary sensors for determining drilling parameters include, but are not limited to drill bit sensors, an RPM sensor, a weight on bit sensor, sensors for measuring mud motor parameters (e.g., mud motor stator temperature, differential pressure across a mud motor, and fluid flow rate through a mud motor), and sensors for measuring acceleration, vibration, whirl, radial displacement, stick-slip, torque, shock, vibration, strain, stress, bending moment, bit bounce, axial thrust, friction, backward rotation, BHA buckling, and radial thrust. Sensors distributed along the drill string can measure physical quantities such as drill string acceleration and strain, internal pressures in the drill string bore, external pressure in the annulus, vibration, temperature, electrical and magnetic field intensities inside the drill string, bore of the drill string, etc. Suitable systems for making dynamic downhole measurements include COPILOT, a downhole measurement system, manufactured by BAKER HUGHES INCORPORATED.

The drilling system 301 can include one or more downhole processors at a suitable location such as 393 on the BHA 390. The processor(s) can be a microprocessor that uses a computer program implemented on a suitable non-transitory computer-readable medium that enables the processor to perform the control of system 301 and processing of information, such as information from the sensors. The non-transitory computer-readable medium may include one or more ROMs, EPROMs, EAROMs, EEPROMs, flash memories, RAMs, hard drives and/or optical disks. Other equipment such as power and data buses, power supplies, and the like will be apparent to one skilled in the art. In one embodiment, the MWD system utilizes mud pulse telemetry to communicate data from a downhole location to the surface while drilling operations take place. The surface processor 342 can process the surface measured data, along with the data transmitted from the downhole processor, to evaluate the formation.

Surface processor 342 or downhole processor 393 may also be configured to control steering apparatus 358, mud pump 334, drawworks 330, rotary table 314, downhole motor 355, other components of the BHA 390, or other components of the drilling system 301. Surface processor 342 or downhole processor 393 may be configured to control sensors described above and to estimate a parameter of interest according to methods described herein.

Control of these components may be carried out using one or more models using methods described below. For example, surface processor 342 or downhole processor 393 may be configured to modify drilling operations i) autonomously upon triggering conditions, ii) in response to operator commands, or iii) combinations of these. Such modifications may include changing drilling parameters, steering the drillbit (e.g., geosteering), altering the drilling fluid program, activating well control measures, and so on. Control of these devices, and of the various processes of the drilling system generally, may be carried out in a completely automated fashion or through interaction with personnel via notifications, graphical representations, user interfaces and the like. Reference information accessible to the processor may also be used. In some general embodiments, surface processor 342, downhole processor 393, or other processors (e.g. remote processors) may be configured to operate the well logging tool 310 to make well logging measurements. Each of these logical components of the drilling system may be implemented as one or more electrical components, such as integrated circuits (ICs), operatively connected via a circuit board in accordance with techniques of the present disclosure.

The system 301 may include any number of downhole tools for various processes including formation drilling, geosteering, and formation evaluation (FE) for making measurements versus depth and/or time of one or more physical properties in or around a borehole, including a volume of interest of the formation intersected by the borehole. The tool 310 may be included in or embodied as a BHA, drillstring component or other suitable carrier.

Figure 4:
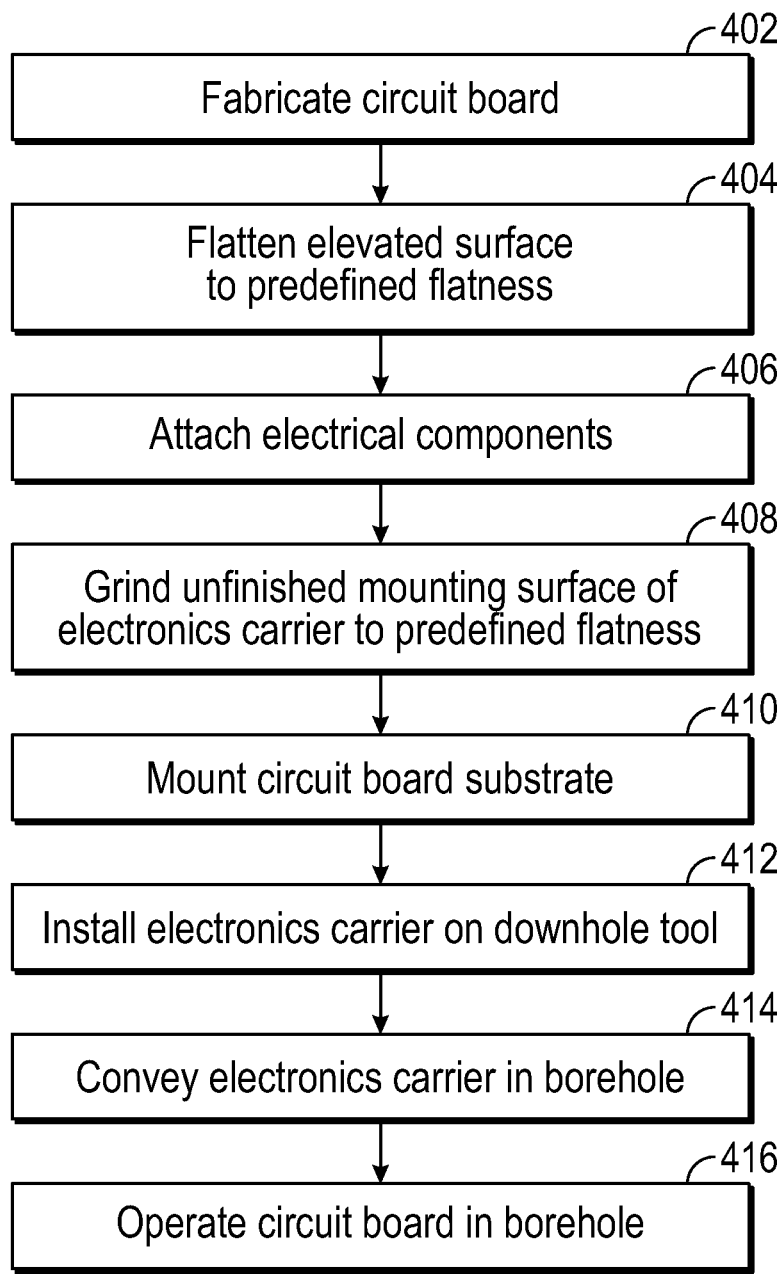
FIG. 4 shows a flowchart illustrating methods for constructing a downhole tool electronics module in accordance with embodiments of the present disclosure.

FIG. 4 shows a flowchart illustrating methods for constructing a downhole tool electronics module in accordance with embodiments of the present disclosure. In first optional step 402, the method may include fabricating a circuit board (CB) ceramic based substrate having an elevated area as a portion of the total surface of one side ('first side'), wherein the thickness of the substrate is greater over the elevated area than in other portions. Fabricating the CB may be carried out as described above in further detail in FIG. 1A. Metallization is a standard processing step in manufacturing ceramic substrate boards. Metallization may include placement of electrically conductive tracks and pads to interconnect electronic components and to solder or wire bond electronics components to the board. Fabricating the circuit board may include incorporating interconnects, feedthroughs, and other integrated components, as known in the art.

In a second step 404, the elevated surface of the substrate may be mechanically ground to a predefined flatness, such as a flatness of no greater than 50 µm, in order to make the finished mounting portion of the first surface. In another optional step 408, the unfinished mounting surface of an electronics carrier may be ground to a predefined flatness, such as a flatness of no greater than 50 µm, to make the finished mounting surface of the electronics carrier. Step 406 may be carried out before and/or after step 408.

Optional step 406 may include attaching electrical components to the substrate. Attaching an electrical component to a printed circuit board may be carried out by mechanically fastening the electrical component to the printed circuit board, by welding, soldering, adhesive attach or sintering, and so on. As described in greater detail above, the circuit board may include electrically conductive contact surfaces (metallized areas) for connection of circuit elements via the board and the electrical component may include at least one circuit element including a plurality of leads or other connections. The assembly process may be done concurrently with placement of parts (e.g., ICs) by an automated pick and place handler. A pick and place header could select from a feeder and bond in place in an electrical assembly a component or subassembly previously manufactured during a previous manufacturing step, either by an additive manufacturing or another assembly or manufacturing technique. The pick and place dispenser could supply passive electrical components (e.g. capacitors, inductors, transformers, etc.), Field Effect Transistors (FET's), Bipolar transistors (BJT), Digital, analog or mixed ICs, SoCs, memory modules or other subassemblies (e.g., MCM assembly with memory IC components), quartz oscillators, and pressure, temperature, piezoelectric, coil, magnetic, and accelerometer sensors. Step 406 may include permanently electrically coupling electrical components to the circuit board.

Step 406 may be carried out in two sub-steps, which may be carried out at two different times, or in various orders, and may have other steps intervening between them. In some implementations, the sequence of assembly may include the sub-step of attaching the backside components, e.g., those components which will reside in a cavity, and the sub-step of attaching the front side components. These sub-steps may be preceded, followed, or separated by other sub-steps. Step 410 comprises mounting the circuit board substrate by adhering the mounting portion of the substrate to the mounting surface of the electronics carrier conveyable in the borehole. Step 410 may be carried out by mounting the CB directly to the electronics housing or to a mounting frame. The mounting frame may be installed on the electronics housing before or after mounting the CB to the mounting frame.

Figure 5A:
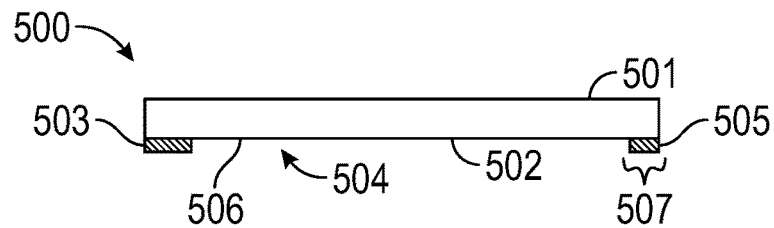
FIG. 5A illustrates a fabricated substrate prior to grinding.
Figure 5B:
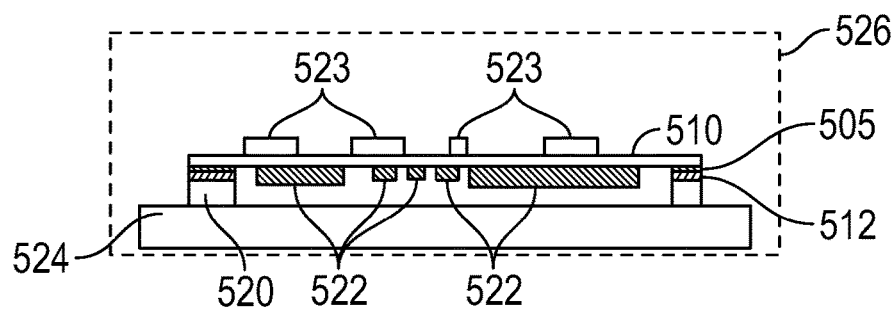
FIG. 5B shows a mounted circuit board.
Figure 5C:
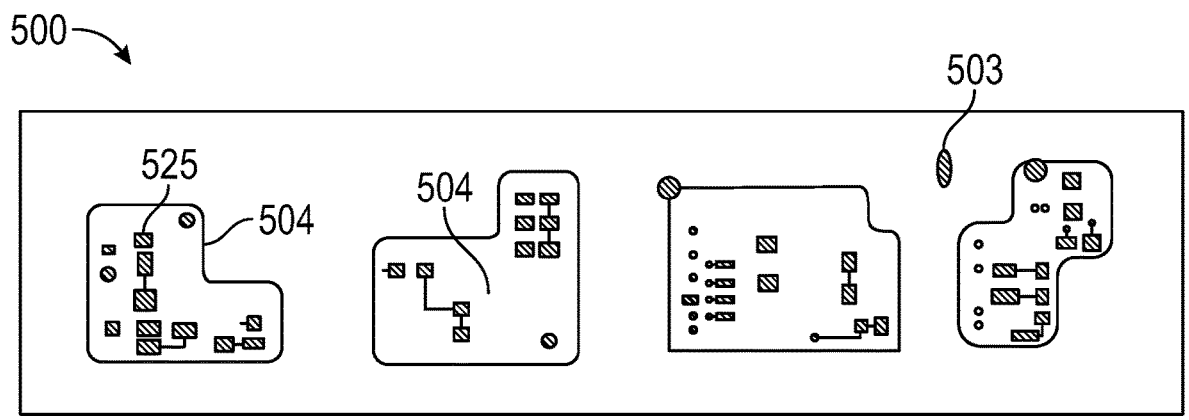
FIG. 5C shows a view of the backside of a circuit board in accordance with embodiments of the disclosure.

FIG. 5A illustrates a fabricated substrate prior to grinding. FIG. 5B shows a mounted circuit board. FIG. 5C shows a view of the backside of a circuit board in accordance with embodiments of the disclosure. Drawings are not to scale.

Prior to grinding, ceramic based substrate 500 includes a front side 501 and a backside 502 having a first surface 506. A portion 504 of the backside is intended for receiving circuit elements. An elevated surface 507 is elevated from the first surface 506 by additional substrate material 505, e.g. from at least one additional ceramic based substrate layer (ceramic sheet) 505. A mounting portion 503 of the backside 502 is intended for adhering to an electronics carrier for installation. To ensure the flatness (e.g., the internal consistency of the area) of mounting portion 503, this material is ground to achieve a first flatness. After grinding, the mounting portion 503 will strongly and robustly bond to electronics carrier 524 (FIG. 5B), which may include at least one of a mounting frame 520 and an electronics housing 526. Thus, after grinding, electronic components 522 are installed on the circuit portion 504 of backside 502, and the completed circuit board 510 is adhered to the mounting frame 520 of electronics carrier 524 at an interface 512 where two surfaces are bonded, e.g., through the use of adhesives. At the interface 512 the mounting portion of the substrate and the mounting surface of the mounting frame are attached to each other by an adhesive. The mounting surface at the mounting frame at interface 512 is ground to a second flatness. The first flatness of the mounting portion and the second flatness of the mounting surface may be the same. Optionally electronics components 523 may be attached also to the front side of the substrate. In an alternative non-limiting embodiment the mounting frame may be substituted by adding more ceramic based substrate layers 505 to achieve sufficient elevation of the mounting portion to add electronic component to the backside of the ceramics-based substrate.

Returning to FIG. 4, mounting may be carried out by adhering a mounting portion of the first surface to a mounting surface of the electronics carrier, such that a portion of the first surface other than the mounting portion has mounted thereon at least one circuit element. The circuit elements are connected to the at least one metallized area 525 (FIG. 5C created by the metallization of the substrate. The first side 111 may be the back side. There may be a second side 112 opposite the first side 111, the front side. At least a portion of the second side 112 may have mounted thereon at least one other circuit element. Adhering the mounting portion to the mounting surface of the electronics carrier may be carried out by adhering the mounting portion to a mounting surface of the electronics carrier housing, or may alternatively be carded out by adhering the mounting portion to a mounting surface of the mounting frame. Optional step 412 may comprise installing the electronics carrier on a downhole tool. Optional step 414 may comprise conveying the electronics carrier in the borehole on the tool. In one example, an electronics carrier may be installed in the BHA 390, as described above. Optional step 416 may include operating the circuit board in the borehole. For example, the circuit board may be operated to make a measurement, actuate a mechanical or electrical device, alter the course of a tool in the borehole (directional drilling, geosteering), or process or store information. Steps may be carried out in a different order, and/or may overlap, and/or split into a plurality of sub-steps which may be carried out simultaneously, in sequence, or with other steps in between.

Figure 6:
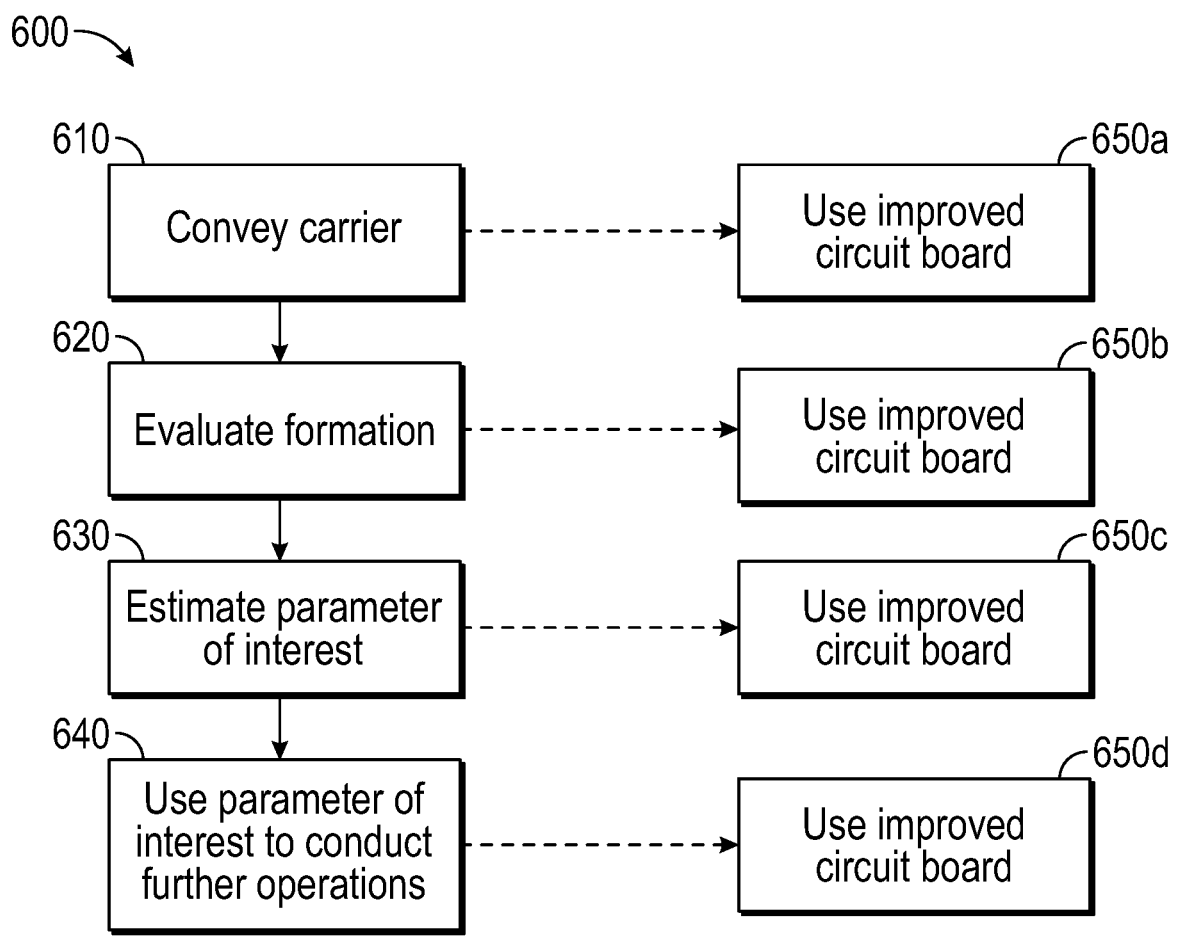
FIG. 6 shows a flow chart illustrating methods for exploring a formation of interest in accordance with embodiments of the present disclosure.

FIG. 6 shows a flow chart 600 illustrating methods for exploring a formation of interest in accordance with embodiments of the present disclosure. In optional step 610, a carrier is conveyed in a borehole in the earth formation. The carrier may be a drill string or portions thereof. The borehole may be filled with downhole fluid, e.g., drilling mud. Conveyance may be carried out by extending the borehole via rotation of a drill bit at the distal end of the string to disintegrate the formation ahead of the bit. Formation evaluation (FE) instruments may be disposed on the conveyance device. Optional step 620 includes using an instrument (e.g. a sensor) to evaluate the formation, which may be carried out by taking measurements in the formation through utilization of physical phenomena (e.g., electro-magnetic interaction, electric interaction, nuclear interaction, pulse echo acoustics) to generate measurement information. Optional step 630 comprises using the measurement information to estimate a parameter of interest. Optional step 640 comprises using the parameter of interest to conduct further operations in the formation. At least one of the steps above comprises conducting operations using an improved printed circuit board of the present disclosure within the borehole (optional steps 650a-650d).

Estimated parameters of interest may be stored (recorded) as information or visually depicted on a display. The parameters of interest (or other formation resistivity measurement information) may be transmitted before or after storage or display. For example, information may be transmitted to other downhole components or to the surface for storage, display, or further processing. Aspects of the present disclosure relate to modeling a volume of an earth formation using the estimated parameter of interest, such as, for example, by associating estimated parameter values with portions of the volume of interest to which they correspond. The model of the earth formation generated and maintained in aspects of the disclosure may be implemented as a representation of the earth formation stored as information. The information (e.g., data) may also be transmitted, stored on a non-transitory machine-readable medium, and/or rendered (e.g., visually depicted) on a display.

The processing of the measurements by a processor may occur at the tool, the surface, or at a remote location. The data acquisition may be controlled at least in part by the electronics. Implicit in the control and processing of the data is the use of a computer program on a suitable non-transitory machine readable medium that enables the processors to perform the control and processing. The non-transitory machine readable medium may include ROMs, EPROMs, EEPROMs, flash memories and optical disks. The term processor is intended to include devices such as a field programmable gate array (FPGA).

The terms "carrier" and "conveyance device" as used above means any device, device component, combination of devices, media and/or member that may be used to convey, house, support or otherwise facilitate the use of another device, device component, combination of devices, media and/or member. Exemplary non-limiting conveyance devices include drill strings of the coiled tube type, of the jointed pipe type and any combination or portion thereof. Other conveyance device examples include casing pipes, wirelines, wire line sondes, slickline sondes, drop shots, downhole subs, BHA's, drill string inserts, modules, internal housings and substrate portions thereof, self-propelled tractors. As used above, the term "sub" refers to any structure that is configured to partially enclose, completely enclose, house, or support a device. The term "information" as used above includes any form of information (Analog, digital, EM, printed, etc.). The term "processor" or "information processing device" herein includes, but is not limited to, any device that transmits, receives, manipulates, converts, calculates, modulates, transposes, carries, stores or otherwise utilizes information. An information processing device may include a microprocessor, resident memory, and peripherals for executing programmed instructions. The processor may execute instructions stored in computer memory accessible to the processor, or may employ logic implemented as field-programmable gate arrays ('FPGAs'), application-specific integrated circuits ('ASICs'), other combinatorial or sequential logic hardware, and so on. Thus, configuration of the processor may include operative connection with resident memory and peripherals for executing programmed instructions.

Method embodiments may include conducting further operations in the earth formation in dependence upon the formation resistivity information, the logs, estimated parameters, or upon models created using ones of these. Further operations may include at least one of: i) extending the borehole; ii) drilling additional boreholes in the formation; iii) performing additional measurements on the formation; iv) estimating additional parameters of the formation; v) installing equipment in the borehole; vi) evaluating the formation; vii) optimizing present or future development in the formation or in a similar formation; viii) optimizing present or future exploration in the formation or in a similar formation; ix) evaluating the formation; and x) producing one or more hydrocarbons from the formation, xi) geosteering.

As used herein, the term "fluid" and "fluids" refers to one or more gasses, one or more liquids, and mixtures thereof. A "downhole fluid" as used herein includes any gas, liquid, flowable solid and other materials having a fluid property and relating to hydrocarbon recovery. A downhole fluid may be natural or man-made and may be transported downhole or may be recovered from a downhole location. Non-limiting examples of downhole fluids include drilling fluids, return fluids, formation fluids, production fluids containing one or more hydrocarbons, engineered fluids, oils and solvents used in conjunction with downhole tools, water, brine, and combinations thereof. An "engineered fluid" may be used herein to mean a human made fluid formulated for a particular purpose. "Predefined flatness" as used herein means a standard of flatness requisite to the desired purpose—that is, enabling a bond sufficiently strong and robust for the operations and environments described herein.

Aspects of the present disclosure relate to modeling a volume of an earth formation. The model of the earth formation generated and maintained in aspects of the disclosure may be implemented as a representation of the earth formation stored as information. The information (e.g., data) may be stored on a non-transitory machine-readable medium, transmitted, and rendered (e.g., visually depicted) on a display.

A circuit element is an element that has a non-negligible effect on a circuit in addition to completion of the circuit. "Significantly electrically conductive," as defined herein refers to materials having a resistivity less than $10^{-5}$ ohm-meters. Vibration and shock and the corresponding acceleration experienced by the components of a MWD/LWD tool may reach levels of greater than 1, 5, 10, 15, 20, 30, or 50 times the force of gravity (gravitational units, g). The electronics carrier and the board attach may be configured for any of these levels of acceleration.

While the foregoing disclosure is directed to the one mode embodiments of the disclosure, various modifications will be apparent to those skilled in the art. It is intended that all variations be embraced by the foregoing disclosure.

What is claimed is:

1. A method for constructing an electronics module for a downhole tool, the method comprising:
providing a circuit board comprising metallizing in at least part of a first surface on a first side of a substrate, the metallizing to define at least one metallized area on the first surface, and wherein the substrate further comprises: a ceramic material, a second surface that is elevated from the first surface and that is on the first side, and a second side opposite the first side;
attaching an electronics component to the first surface; and
mounting the circuit board on an electronics carrier that is a single structure, wherein the electronics component resides at least partially within a pocket of the electronics carrier, and wherein the electronics module is enclosed within a cavity in the downhole tool.

2. The method of claim 1, further comprising:
flattening at least partially the second surface that is elevated to a predefined first flatness for the mounting of the circuit board on the electronics carrier.

3. The method of claim 2, further comprising:
flattening a mounting surface of the electronics carrier to a predefined second flatness.

4. The method of claim 2, wherein the predefined first flatness no greater than 50 micrometers.

5. The method of claim 1, wherein the first surface comprises a first ceramic sheet and the second surface that is elevated comprises at least a second ceramic sheet.

6. The method of claim 5, further comprising:
creating the second surface that is elevated by punching the second ceramic sheet prior to placing the first ceramic sheet and the second ceramic sheet in a stack.

7. The method of claim 1, further comprising:
creating the substrate by stacking ceramic sheets;
laminating the stacked ceramic sheets together as a stack; and
sintering the stack.

8. The method of claim 1, further comprising:
creating the second surface by green milling.

9. The method of claim 1, further comprising:
adhering a mounting portion of the second surface of the substrate to a mounting surface of the electronics carrier using an adhesive between the mounting portion and the mounting surface.

10. The method of claim 1, wherein the electronics carrier is formed as part of an electronics housing that comprises a mounting surface for adhering to a mounting portion of the second surface of the substrate.

11. The method of claim 1, wherein the electronics carrier comprises a mounting frame having a mounting surface for adhering to a mounting portion of the second surface of the substrate.

12. The method of claim 11, wherein the mounting frame is made from a ceramic material.

13. The method of claim 1, wherein the second side of the substrate comprises a third surface and a fourth surface, the fourth surface elevated from the third surface, and the method further comprising:

flattening at least partially the fourth surface to a predefined flatness to create a further mounting portion relative to a mounting portion on the second surface.

14. The method of claim 13, wherein the third surface is at least partly metallized to define at least one further metallized area on the third surface relative to the at least one metallized area on the first surface, and wherein the second side of the substrate has at least one other electronic component mounted thereon.

15. The method of claim 1, wherein the first surface comprises at least one depression.

16. An apparatus for performing well logging in a borehole intersecting an earth formation, the apparatus comprising:
- a downhole tool including an electronics module that has an electronics carrier, the electronics carrier being a single structure and comprising a pocket; and
- a circuit board to be mounted on the electronics carrier, the circuit board including a substrate comprising a ceramic material, a first side, and a second side opposite the first side, the first side including at least a first surface and a second surface, the second surface elevated from the first surface, wherein at least part of the first surface is metallized to define at least one metallized area on the first surface, and wherein an electronics component is attached to the first surface and resides at least partially within the pocket of the electronics carrier, and wherein the electronics module is enclosed within a cavity in the downhole tool.

17. A method for constructing a downhole tool electronics module, the method comprising:
- providing a circuit board comprising metallizing in at least part of a first surface on a first side of a substrate, the metalizing to define at least one metallized area on the first surface, and wherein the substrate is formed from a monolithic ceramic material, the substrate further comprises: a second surface that is elevated from the first surface and that is on the first side, and a second side opposite the first side;
- attaching an electronics component to the first surface; and
- mounting the circuit board on an electronics carrier, wherein the second surface is created by one of: (i) molding or (ii) green milling the monolithic ceramic material.

18. The method of claim 17, flattening at least partially the second surface that is elevated to a predefined first flatness for the mounting of the circuit board on the electronics carrier.

19. The method of claim 18, further comprising: flattening a mounting surface of the electronics carrier to a predefined second flatness.

* * * * *